United States Patent
Haertl et al.

(10) Patent No.: US 9,685,504 B2
(45) Date of Patent: Jun. 20, 2017

(54) SEMICONDUCTOR TO METAL TRANSITION FOR SEMICONDUCTOR DEVICES

(71) Applicant: Infineon Technologies AG, Neubiberg (DE)

(72) Inventors: Andreas Haertl, Munich (DE); Frank Hille, Munich (DE); Francisco Javier Santos Rodriguez, Villach (AT); Daniel Schloegl, Villach (AT); Andre Rainer Stegner, Munich (DE); Christoph Weiss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/253,070

(22) Filed: Aug. 31, 2016

(65) Prior Publication Data

US 2016/0372539 A1   Dec. 22, 2016

Related U.S. Application Data

(63) Continuation of application No. 14/940,797, filed on Nov. 13, 2015, now Pat. No. 9,443,971.

(30) Foreign Application Priority Data

Nov. 14, 2014   (DE) .................. 10 2014 223 315

(51) Int. Cl.
    *H01L 29/00*    (2006.01)
    *H01L 21/22*    (2006.01)
    (Continued)

(52) U.S. Cl.
    CPC ...... *H01L 29/063* (2013.01); *H01L 21/28568* (2013.01); *H01L 29/0607* (2013.01);
    (Continued)

(58) Field of Classification Search
    CPC ............... H01L 29/036; H01L 29/7801; H01L 29/7393; H01L 29/66325
    (Continued)

(56) References Cited

U.S. PATENT DOCUMENTS

| | | | |
|---|---|---|---|
| 6,888,211 B2 | 5/2005 | Mauder et al. | |
| 8,008,712 B2 | 8/2011 | Hille et al. | |
| 2007/0093019 A1 | 4/2007 | Rieger et al. | |

FOREIGN PATENT DOCUMENTS

| | | |
|---|---|---|
| DE | 10261424 B3 | 7/2004 |
| DE | 112011106033 T5 | 8/2014 |

*Primary Examiner* — David S Blum
(74) *Attorney, Agent, or Firm* — Murphy, Bilak & Homiller, PLLC (57) ABSTRACT

A semiconductor device includes a first semiconductor region having first charge carriers of a first conductivity type and a second semiconductor region having second charge carriers. The first semiconductor region includes a transition region in contact with the second semiconductor region, the transition region having a first concentration of the first charge carriers, a contact region having a second concentration of the first charge carriers, wherein the second concentration is higher than the first concentration, and a damage region between the contact region and the transition region. The damage region is configured for reducing lifetime and/or mobility of the first charge carriers of the damage region as compared to the lifetime and/or the mobility of the first charge carriers of the contact region and the transition region.

17 Claims, 4 Drawing Sheets

(51) Int. Cl.
*H01L 21/38* (2006.01)
*H01L 29/06* (2006.01)
*H01L 29/78* (2006.01)
*H01L 29/739* (2006.01)
*H01L 29/66* (2006.01)
*H01L 29/10* (2006.01)
*H01L 29/32* (2006.01)
*H01L 21/285* (2006.01)
*H01L 29/167* (2006.01)
*H01L 29/861* (2006.01)
*H01L 21/265* (2006.01)

(52) U.S. Cl.
CPC ........ *H01L 29/1095* (2013.01); *H01L 29/167* (2013.01); *H01L 29/32* (2013.01); *H01L 29/66136* (2013.01); *H01L 29/66325* (2013.01); *H01L 29/66674* (2013.01); *H01L 29/7393* (2013.01); *H01L 29/7801* (2013.01); *H01L 29/861* (2013.01); *H01L 21/26506* (2013.01)

(58) Field of Classification Search
USPC .......................................... 257/502; 438/549
See application file for complete search history.

FIG 3

SEMICONDUCTOR TO METAL TRANSITION FOR SEMICONDUCTOR DEVICES

PRIORITY CLAIM

This application is a Continuation of U.S. patent application Ser. No. 14/940,797 filed on 13 Nov. 2015, now U.S. Pat. No. 9,443,971, which in turn claims priority to German Patent Application No. 10 2014 223 315.1 filed on 14 Nov. 2014, the content of both of said applications incorporated herein by reference in their entirety.

TECHNICAL FIELD

This specification refers to embodiments of a semiconductor device and to embodiments of a semiconductor component to metal contact transition, for example to embodiments of a diode, an IGBT, a MOSFET and the like, and to embodiments of a method of manufacturing such products. In particular, this specification refers to embodiments of a low resistant semiconductor component to metal contact transition and to embodiments of a semiconductor device comprising such low resistant semiconductor to metal contact transition as well as to embodiments of a method of manufacturing such products.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs) and Metal Oxide Semiconductor Field Effect Transistors (MOSFETs) and diodes have been used for various applications including, but not limited to switches in power supplies and power converters.

Many of such semiconductor devices used in power electronics are diodes or comprise diode structures such as the diode structures of reverse conducting IGBTs or the built-in body diodes of MOSFETs.

Often, the anode of such diode structures has a relatively low doping level, i.e., the emitter efficiency is kept low in order to form the charge carrier concentration in a way that is advantageous for the dynamic switching behavior, such as soft recovery. At the same time, it is sometimes desirable to ensure a low ohmic contact between the anode and, e.g., a front side metallization, which is generally challenging, given the low doping level of the anode.

SUMMARY

According to an embodiment, a semiconductor device is provided. The semiconductor device comprises a first semiconductor region having first charge carriers of a first conductivity type and a second semiconductor region having second charge carriers. The first semiconductor region includes a transition region in contact with the second semiconductor region, the transition region having a first concentration of the first charge carriers. The first semiconductor region further includes a contact region having a second concentration of the first charge carriers, wherein the second concentration is higher than the first concentration. The first semiconductor region also includes a damage region between the contact region and the transition region, the damage region being configured for reducing lifetime and/or mobility of the first charge carriers of the damage region as compared to the lifetime and/or the mobility of the first charge carriers of the contact region and the transition region.

According to a further embodiment, a semiconductor component to metal contact transition is provided. The metal contact comprises a metallization layer configured for being contacted by an external contactor. The metallization layer is further configured for receiving a load current via the external contactor. The semiconductor component comprises a first semiconductor region having first charge carriers of a first conductivity type and a second semiconductor region having second charge carriers. The first semiconductor region includes a transition region in contact with the second semiconductor region, the transition region having a first concentration of the first charge carriers. The first semiconductor region also includes a contact region having a second concentration of the first charge carriers, wherein the second concentration is higher than the first concentration. The first semiconductor region further includes a damage region between the contact region and the transition region, the damage region being configured for reducing lifetime and/or mobility of the first charge carriers of the damage region as compared to the lifetime and/or the mobility of the first charge carriers of the contact region and the transition region.

According to yet a further embodiment, a method of manufacturing a semiconductor device is presented. The method comprises providing a first semiconductor region having first charge carriers of a first conductivity type and a second semiconductor region having second charge carriers, wherein the first semiconductor region comprises a transition region in contact with the second semiconductor region, the transition region having a first concentration of the first charge carriers. The method further comprises creating, in the first semiconductor region, a contact region having a second concentration of the first charge carriers that is higher than the first concentration. The method also comprises creating, in the first semiconductor region, a damage region such that the damage region is configured for reducing lifetime and/or mobility of the first charge carriers of the damage region as compared to the lifetime and/or the mobility of the first charge carriers of the contact region and the transition region.

Features of further embodiments are defined in the dependent claims. The features of further embodiments and the features of the embodiments described above may be combined with each other for forming additional embodiments, as long as said features are not explicitly described as being alternative to each other.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Many of power semiconductor devices used in power electronics are diodes or comprise diode structures such as the diode structures of reverse conducting IGBTs or the built-in body diodes of MOSFETs. Often, the anode of such diode structures has a relatively low doping level, i.e., the emitter efficiency is kept low in order to form the charge carrier concentration in a way that is advantageous for the dynamic switching behavior, such as soft recovery. At the same time, it is sometimes desirable to ensure a low ohmic contact between the anode and, e.g., a front side metallization, which is generally challenging, given the low doping level of the anode.

For example, the problem of creating a low ohmic contact between a low doped anode and a contact metal can be solved by using an appropriate contact metal material. To this end, aluminum as a contact metal provides for a relatively low Schottky barrier and, in addition, has itself a p-type doping effect resulting in a relatively low ohmic contact with p-doped silicon.

However, occasionally the choice of the contact metal material may be limited because the presence of a diffusion barrier layer between the metallization and the semiconductor may be required. For example, in the case of a copper metallization, which is also known as "power copper", tungsten (W) or titanium tungsten (TiW) may be employed for the diffusion barrier layer. Generally, these materials do not provide a low ohmic contact with a low doped silicon anode.

In order to lower the contact resistance between the p-doped silicon anode and a metallization, which may comprise, e.g., a diffusion barrier layer, an intermediate layer of, e.g., platinum silicide (PtSi) may be inserted. This has, however, practical disadvantages in terms of the compatibility with other steps in the manufacturing process chain, e.g., due to the risk of platinum cross contaminations.

As another option for generating a low ohmic contact between a p-doped silicon anode and a metallization, a high p-dopant level may be provided either for the whole anode region or, alternatively, only in a narrow contact region close to a semiconductor surface that is in contact with the metallization. This has the disadvantage that the high p-dopant level causes high emitter efficiency leading to higher switching losses and snappy switching behavior. It may be desirable to overcome such drawbacks.

In the following, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor contact region.

The term "vertical" as used in this specification intends to describe an orientation which is substantially arranged perpendicular to the horizontal surface, i.e. parallel to the normal direction of the surface of the semiconductor substrate or the semiconductor contact region.

In this specification, p-doped may refer to said first conductivity type while n-doped may refer to said second conductivity type. Alternatively, embodiments of the semiconductor device presented below can be formed with opposite doping relations so that the first conductivity type can be n-doped and the second conductivity type can be p-doped. For example, the first charge carriers may be holes and the second charge carriers may be electrons. In other embodiments, the first charge carriers and the second charge carriers may both be electrons. Further, other variations are possible. For example, first charge carriers included in a first semiconductor region 12 presented below may be formed by acceptors, and second charge carriers included in a second semiconductor region 13 presented below may be formed by donors. In other embodiments, both the first charge carriers and the second charge carriers may be formed by donors or, in yet further embodiments, both the first charge carriers and the second charge carriers may be formed by acceptors. The same applies for embodiments of a semiconductor component presented below.

In the context of the present specification, the terms "in ohmic contact", "in electric contact", "in ohmic connection", and "electrically connected" intend to describe that there is a low ohmic electric connection or low ohmic current path between two regions, sections, portions or parts of a semiconductor device or between different terminals of one or more devices or between a terminal or a metallization or an electrode and a portion or part of a semiconductor device. The same applies to embodiments of a semiconductor component to metal contact transition presented below. Further, in the context of the present specification, the term "in contact" intends to describe that there is a direct physical connection between two elements of the respective semiconductor device/transition; e.g., a transition between two elements being in contact with each other should not include a further intermediate element or the like.

Specific embodiments described in this specification pertain to, without being limited thereto, monolithically integrated power semiconductor devices having a diode structure, an IGBT structure, a reverse conducting IGBT structure or a MOSFET structure.

The term "power semiconductor device" as used in this specification intends to describe a semiconductor device on a single chip with high voltage blocking and switching and/or high current carrying and switching capabilities. In other words, power semiconductor devices are intended for high current, typically in the Ampere range, e.g., up to several hundred Ampere, and/or high voltages, typically above 200 V, more typically 600 V and above.

Figure 1:
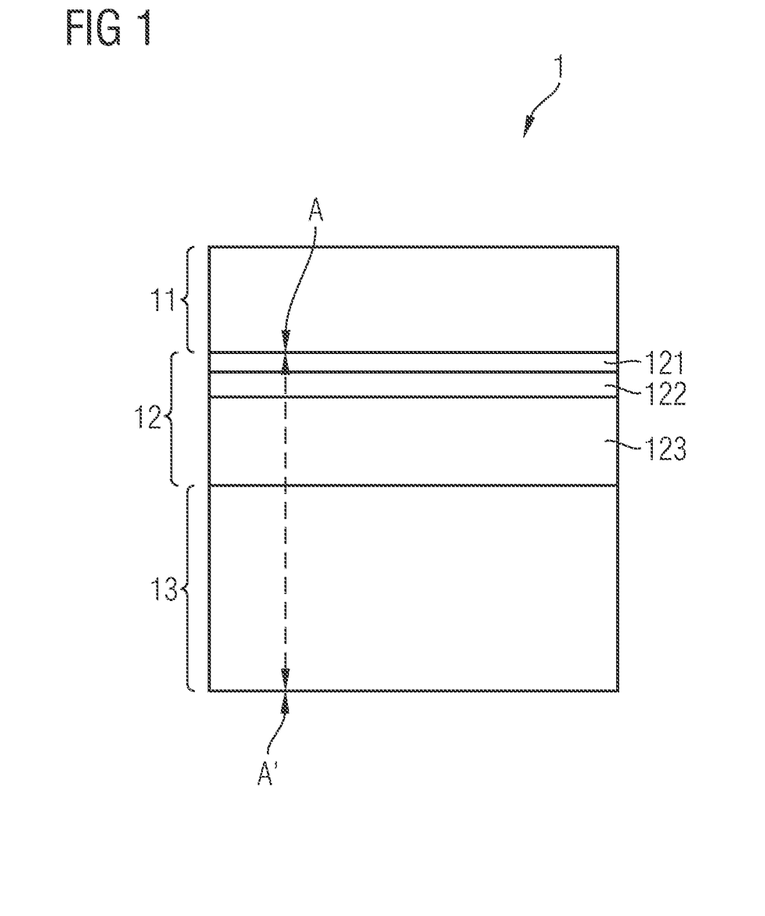
FIG. 1 schematically illustrates a section of a vertical cross-section of a semiconductor device according to one or more embodiments.

FIG. 1 schematically illustrates a section of a vertical cross-section of a semiconductor device 1 according to one or more embodiments. The semiconductor device 1 comprises a diffusion barrier layer 11, a first semiconductor region 12 having first charge carriers of a first conductivity type and a second semiconductor region 13 having second charge carriers.

For example, the diffusion barrier layer 11 can be arranged between a copper metallization layer (not shown in FIG. 1) and the semiconductor region 12 and configured to prevent diffusion of copper (Cu) into the semiconductor region 12. The diffusion barrier layer 11 may be a metal layer and may be made from a metal or metal composition free of copper. For example, the diffusion barrier layer 11 may comprise at least one of titanium (Ti), tungsten (W), titanium tungsten (TiW), titanium nitride (TiN), nickel (Ni), tantalum (Ta), tantalum nitride (TaN), and ruthenium (Ru).

The second charge carriers of the second semiconductor region 13 may be charge carriers of a second conductivity type complementary to the first conductivity type. For example, the first semiconductor region 12 forms a p-doped anode structure. In another embodiment, the first semiconductor region 12 may form a p-base region of an IGBT or a p-body region of a MOSFET. The second semiconductor region 13 may form a drift region of the semiconductor device 1, for example an n-drift region.

Alternatively, the second charge carriers of the second semiconductor region 13 are charge carriers of the first conductivity type. For example, the first semiconductor region 12 forms a n-doped cathode region of a diode. Alternatively, the first semiconductor region 12 may form an n-doped diode region on a collector side of a vertical reverse conducting IGBT or an n-doped drain region of a MOSFET. The second semiconductor region 13 may form a drift region of the semiconductor device 1, for example an n-drift region.

The second semiconductor region 13 can be doped with a second semiconductor region doping material, wherein the second semiconductor region doping material establishes presence of said second charge carriers. For example, the second semiconductor region doping material comprises at least one of phosphorus (P), arsenic (As), and antimony (Sb).

The first semiconductor region 12 includes a transition region 123 in contact with the second semiconductor region 13, wherein the transition region 123 exhibits a first concentration of the first charge carriers. For example, a transition between the transition region 123 and the second semiconductor region 13 forms a pn-junction. For example, the transition region 123 may form a p-doped anode region that is in contact with the second semiconductor region 13, which may form, as indicated above, an n-drift region. The p-doped anode region in contact with the second semiconductor region 13 may be implemented in a diode or in a diode cell of a reverse conducting IGBT. In another application, the transition region 123 may form a p-base region of an IGBT or a p-body region of a MOSFET.

The first semiconductor region 12 further includes a contact region 121 in contact with the diffusion barrier layer 11, the contact region 121 having a second concentration of the first charge carriers, wherein the second concentration is higher than the first concentration.

For example, the contact region 121 is doped with a contact region doping material, wherein the contact region doping material establishes presence of said first charge carriers in the contact region 121. The contact region doping material may comprise at least one of boron (B) and phosphorus (P). For example, the contact region 121 forms a $p^+$ contact region of an anode of a diode, a $p^+$ contact region of a p-base region of an IGBT, or a $p^+$ contact region of a p-body region of a MOSFET. In other applications, the contact region 121 may form an $n^+$ contact region of a cathode of a diode, an $n^+$ contact region of an n-doped diode region on a collector side of a vertical reverse conducting IGBT, or an $n^+$ contact region of an n-doped drain region of a MOSFET.

The transition region 123 may be doped with the same contact region doping material as the contact region 121. The contact region doping material optionally included in the transition region 123 establishes presence of said first charge carriers in the transition region 123. For example, both the transition region 123 and the contact region 121 may be doped with at least one of boron (B) and phosphorus (P).

In order establish a low ohmic contact with the diffusion barrier layer 11, the contact region 121 may exhibit a comparatively high $p^+$-type or $n^+$-type doping level, i.e., a comparatively high second concentration of first charge carriers. The $p^+$-type or $n^+$-type doping may be substantially higher than usual contact region doping levels.

The first semiconductor region 12 also includes a damage region 122 between the contact region 121 and the transition region 123. The damage region 122 may be in contact with contact region 121 on the one side and in contact the transition region on the opposite side. The damage region 122 is configured for reducing the lifetime and/or the mobility of the first charge carriers of the damage region 122 as compared to the lifetime and/or the mobility of the first charge carriers of the contact region 121 and the transition region 123. For example, the damage region comprises a plurality of lattice damages in a semiconductor lattice of the damage region 122, the plurality of lattice damages reducing the lifetime and/or the mobility of the first charge carriers of damage region 122.

As a consequence, the damage region 122 may weaken an emitter efficiency of the first semiconductor region 12, thereby compensating for, e.g., a high $p^+$ doping level of the contact region 121. In an exemplary application, the damage region 122 may weaken the emitter efficiency of an anode of a diode, thereby compensating for a comparatively high second concentration of first charge carriers, e.g., a high $p^+$-type doping level of the contact region 121 of a diode. Thus, the switching behavior of the semiconductor device 1 is not deteriorated by the highly doped contact region 121.

The damage region 122 may be doped with a damage region doping material. For example, the damage region doping material comprises at least one of germanium (Ge), silicon (Si), carbon (C), helium (He), neon (Ne), argon (Ar), xenon (Xe), and krypton (Kr).

In an embodiment, the damage region doping material may not be activated. For example, acceptors and/or donors are not activated electrically, e.g., be thermal annealing. Due to the non-activation of the damage doping material, the damage region 122 may fulfill its primary function, namely to reduce the lifetime and/or the mobility of the first charge carriers of the damage region 122 as compared to the lifetime and/or the mobility of the first charge carriers of the neighboring regions, namely the contact region 121 and the transition region 123.

Figure 2:
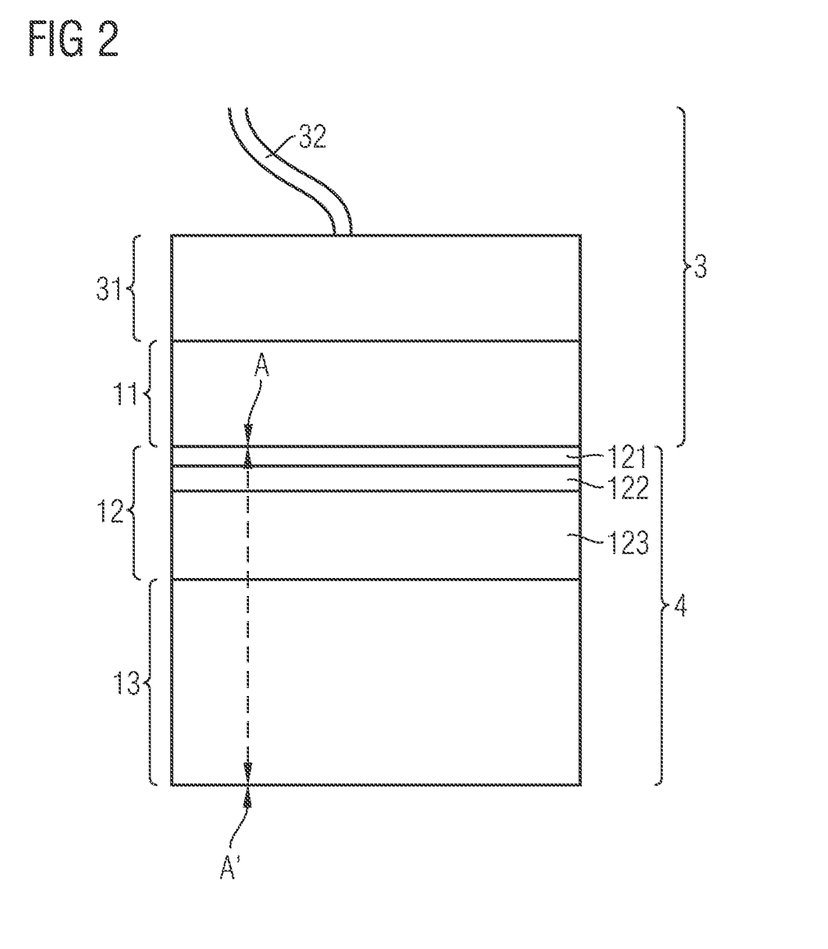
FIG. 2 schematically illustrates a section of a vertical cross-section of a semiconductor component to metal contact transition according to one or more embodiments.

FIG. 2 schematically illustrates a section of a vertical cross-section of a semiconductor component 4 to metal contact 3 transition according to one or more embodiments. The semiconductor component 4 exhibits a structure that is essentially identical to the structure of the semiconductor device illustrated in FIG. 1. Thus, concerning the structure of the semiconductor component 4, it may be referred to the above. However, the semiconductor component does not comprise said diffusion barrier layer 11. Rather, the diffusion barrier layer 11 is part of the metal contact 3. It shall be remarked that the structure of the semiconductor component 4 may by implemented within a power semiconductor device, such as diode, an IGBT, a reverse conducting IGBT, a MOSFET and the like.

As illustrated in FIG. 2, the metal contact 3 may further comprise a metallization layer 31, the metallization layer 31 being in contact with the diffusion barrier layer 11 and being configured for being contacted by an external contactor 32, wherein the diffusion barrier layer 11 is arranged in between the metallization layer 31 and the first semiconductor region 12. The metallization layer 31 is configured for receiving a load current via the external contactor 32 and for feeding the received load current into the diffusion barrier layer 11. For example, the external contactor 32 comprises at least one bond foot. The semiconductor component 4 may be configured for conducting such load current.

The metallization layer 31 may comprise at least one of copper (Cu), aluminum (Al), aluminum copper (AlCu), aluminum silicon copper (AlSiCu), palladium (Pd), molybdenum (Mo), nickel (Ni), nickel phosphorus (NiP), silver (Ag), and gold (Au).

The semiconductor component 4 comprises said first semiconductor region 12 having first charge carriers of a first conductivity type and said second semiconductor region 13 having second charge carriers. As already elaborated with respect to FIG. 1, the first semiconductor region 12 includes said transition region 123 in contact with the second semiconductor region 13, the transition region 123 having a first concentration of the first charge carriers. The first semiconductor region 12 further includes said contact region 121 in contact with the diffusion barrier layer 11 of the metal contact 3, the contact region 121 having a second concentration of the first charge carriers, wherein the second concentration is higher than the first concentration. The first semiconductor region 12 also includes said damage region 122 between the contact region 121 and the transition region 123, the damage region 122 being configured for reducing the lifetime and/or the mobility of the first charge carriers of the damage region 122 as compared to the lifetime and/or the mobility of the first charge carriers of the contact region 121 and the transition region 123. Regarding further optional aspects of the semiconductor component 4, it is referred to the above description of the semiconductor device 1.

For example, for producing the metal contact 3, it is not necessary to include an extra contact layer, such as a PtSi-based layer or PtSi grains. Thus, it may still be possible to adjust the lifetime of the first and/or second charge carriers by means other than by diffusing Pt, such as by Pt implantation or electron irradiation.

Figure 3:
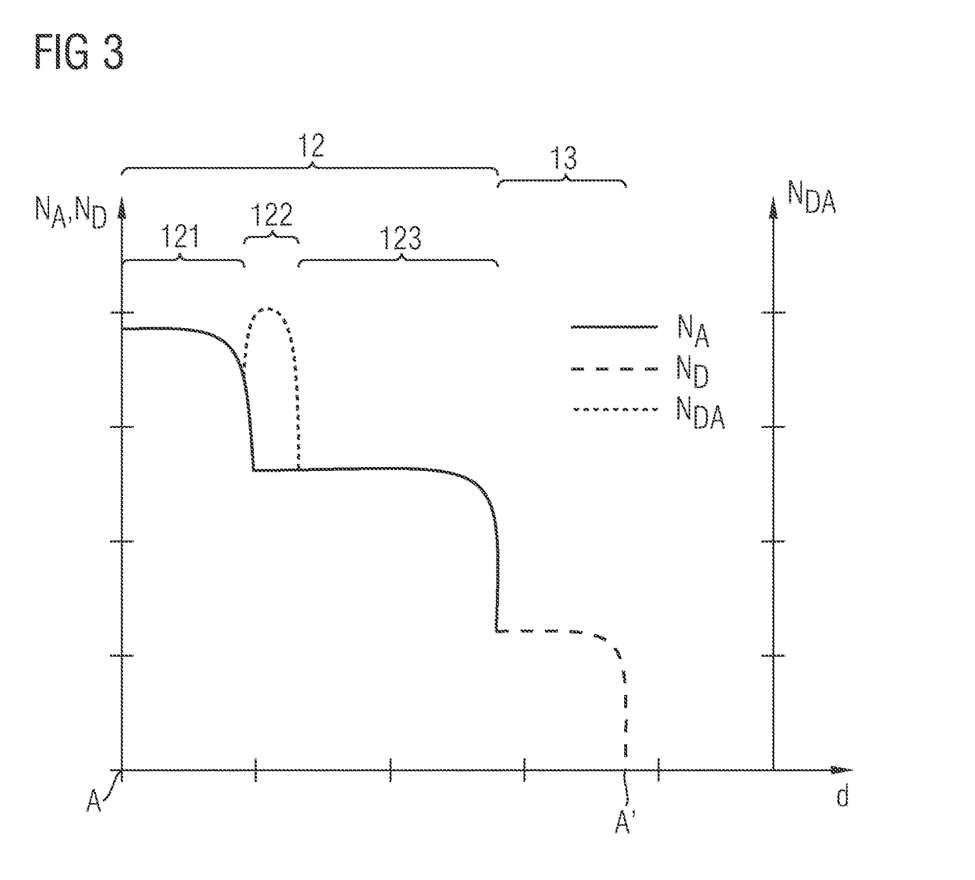
FIG. 3 schematically illustrates an exemplary concentrations of donors, acceptors, and damages according to one or more embodiments.

FIG. 3 schematically illustrates an exemplary donor concentration of $N_D$, acceptor concentration $N_A$, and damage concentration $N_{DA}$ along a virtual line connecting points A and A' shown in FIG. 1 and in FIG. 2.

The virtual line A-A' is substantially parallel to a direction of a flow of a load current conducted by the semiconductor device 1 illustrated in FIG. 1 or, respectively, by the semiconductor component 4 illustrated in FIG. 2. In other words, the virtual line A-A' extends vertically into the semiconductor device 1 or, respectively, into the semiconductor component 4. For example, the virtual line A-A' may extend into a direction that is substantially perpendicular to a surface of the contact region 121.

It should be noted that, in the example illustrated in FIG. 3, the graphic representation of the concentrations over the depth d of the semiconductor device 1 or, respectively, the depth d of the semiconductor component 4, is based on a double logarithmic scale, wherein the depth d amounts to approximately zero at point A and, e.g., to some 10 μm, such as 90 μm, at point A'. Further, it should be noted that the concentrations of donors ($N_D$) and acceptors ($N_A$) may be indicated in $cm^{-3}$. Also, the damage concentration $N_{DA}$ may be indicated in $cm^{-3}$ or, alternatively, be indicated in arbitrary units.

In FIG. 3, the acceptor concentration $N_A$ over depth d may indicate the extension of the first semiconductor region 12 (solid line), and the donor concentration ($N_D$) profile as a function of the depth d may indicate the extension of the second semiconductor region 13 (dashed line).

The extension of the damage region 122 can be indicated by the damage concentration (dotted line). The damage region 122 is located between the contact region 121 and the transition region 123. Thus, the damage concentration $N_{DA}$ (dotted line) in connection with the acceptor concentration $N_A$ (solid line) may define the extensions of the contact region 121 and the transition region 123.

For example, the damage region 122 extends, in a direction of a flow of a load current conducted by the semiconductor device 1, deeper into the first semiconductor region 12 as compared to the contact region 121. Further, the transition region 123 may extend deeper into the first semiconductor region 12 as compared to the damage region 122. In other words, the first semiconductor region 12 may be arranged on top of (over) the second semiconductor region 11 and below the diffusion barrier layer 11. For example, the damage region 122 may be arranged on top of (over) the transition region 123 and below the contact region 121. This aspect is schematically illustrated with the concentrations depicted in FIG. 3.

In an embodiment, the contact region 121 may exhibit, in a direction of a flow of a load current conducted by the semiconductor device 1 or, respectively, by the semiconductor component 4, a thickness in the range of 50 nm to 1000 nm. For example, in accordance with the embodiment illustrated in FIG. 3, the contact region 121 may extend to a depth of 100 nm.

Further, the damage region 122 may exhibit, in a direction of a flow of a load current conducted by the semiconductor device 1 or, respectively, by the semiconductor component 4, a thickness in a range of 50 nm to 1000 nm. For example, in accordance with the embodiment illustrated in FIG. 3, the damage region 122 extends to a depth of about 200 nm.

Regarding now the transition region 123 of the first semiconductor region 12, the transition region 123 may exhibit, in a direction of a flow of a load current conducted by the semiconductor device 1 or, respectively, by the semiconductor component 4, a thickness in the range of 200 nm to 10000 nm. For example, in accordance with the embodiment illustrated in FIG. 3, the transition region 123 may extend to a depth of several μm.

As indicated above, the second concentration of the first charge carriers in the contact region 121 is higher than the first concentration of the first charge carriers in the transition region 123. In accordance with the embodiment illustrated in FIG. 3, the first charge carriers may be formed by acceptors and the second charge carriers may be formed be donors. For example, the second concentration of is at least 50 times as high as the first concentration. In accordance with the exemplary embodiment illustrated in FIG. 3, the second concentration of the first charge carriers in the contact region 121 may be nearly two orders of magnitudes higher than the first concentration of the first charge carriers in the transition region 123

Figure 4:
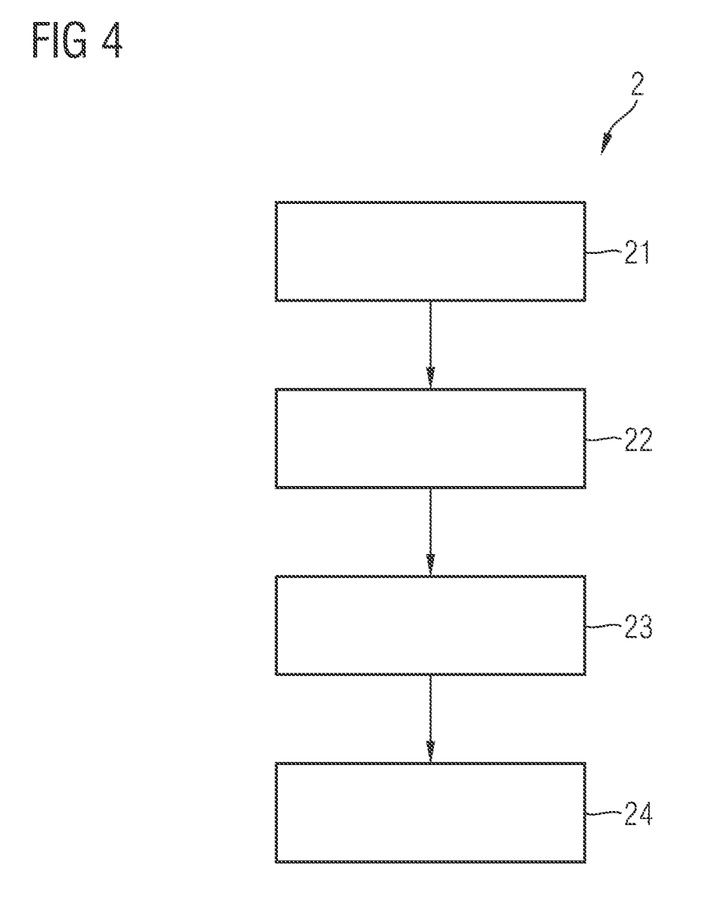
FIG. 4 schematically illustrates a flow diagram of a method of manufacturing a semiconductor device according to one or more embodiments.

FIG. 4 schematically illustrates a flow diagram of a method 2 of manufacturing a semiconductor device according to one or more embodiments. For example, the method 2 may be employed for manufacturing the semiconductor device 1 or, respectively, the semiconductor component 4 to metal contact 3 transition as schematically illustrated in FIG. 1 and FIG. 2. For simplicity, it is referred also to FIG. 1 and FIG. 2 in the following.

The method 2 comprises providing, in a first step 21, a first semiconductor region 12 having first charge carriers of a first conductivity type and a second semiconductor region 13 having second charge carriers. The first semiconductor region 12 is provided such that it comprises a transition region 123 in contact with the second semiconductor region 13, wherein the transition region 123 exhibits a first concentration of the first charge carriers.

In a second step 22 of the method 2, a contact region 121 is created in the first semiconductor region 12 such that the contact region 121 exhibits a second concentration of the first charge carriers that is higher than the first concentration. In an embodiment, creating the contact region 121 may comprise implanting a contact region doping material. For example, the contact region doping material comprises at least one of boron (B) and phosphorus (P). Further, an implantation dose of said implanting may be in the range of $10^{13}$ cm$^{-2}$ to $10^{16}$ cm$^{-2}$. The contact region doping material establishes presence of said first charge carriers in the contact region 121. For example, the implantation dose can be such that a very high p$^+$-type doping level (i.e., a very high acceptor concentration, as exemplary indicated in FIG. 3) or n$^+$-type doping level (i.e., a very high donor concentration) is created in the contact region 121. The p$^+$-type or n$^+$-type doping may be substantially higher than usual contact region doping levels. For example, the implantation dose of an implantation with boron (B) may be 1×10$^{15}$ cm$^{-2}$, e.g., at an implantation energy of 30 keV.

The method 2 also comprises creating, in a third step 23, in the first semiconductor region 12, a damage region 122. Creating the damage region 122 may comprise applying a damage implantation of a damage region doping material between the contact region 121 and the transition region 123, such that the damage region 122 is configured for reducing the lifetime and/or the mobility of the first charge carriers of the damage region 122 as compared to the lifetime and/or the mobility of the first charge carriers of the contact region 121 and the transition region 123.

For example, the damage region doping material may comprise at least one of germanium (Ge), silicon (Si), carbon (C), helium (He), neon (Ne), argon (Ar), xenon (Xe), and krypton (Kr), wherein an implantation dose of said damage implantation is in the range of 10$^{11}$ cm$^{-2}$ to 10$^{15}$ cm$^{-2}$. For example, the implantation dose for a damage implantation with argon (Ar) may be 2×10$^{14}$ cm$^{-2}$, e.g., at an implantation energy of 400 keV.

The method 2 further comprises, in a forth step 24, depositing a diffusion barrier layer 11 on the first semiconductor region 12. For example, tungsten (W) or titanium tungsten (TiW) may be used as material for the diffusion barrier layer 11. These materials are suitable for creating a diffusion barrier between, e.g., copper (Cu) included a metallization layer 31 and said first semiconductor region 12. Thus, the method 2 may also comprise creating the metallization layer 31 on top of diffusion barrier layer 11.

Within implementing said method 2, it may be ensured said the damage doping material is not activated during the manufacturing process, e.g., due to a thermal annealing process. The non-activation of the damage region doping material may ensure the primary function of the damage region 122, namely to reduce the lifetime and/or the mobility of the first charge carriers of the damage region 122 as compared to the lifetime and/or the mobility of the first charge carriers of the contact region 121 and the transition region 123.

Even though formulations as "first step", "second step" etc. have been used above, the order of carrying out the steps of the method 2 may be varied if suitable for the process of manufacturing said semiconductor device or, respectively, said semiconductor component to metal contact transition.

Generally speaking, since the damage region 122 between the contact region 121 and the transition region 123 is configured for reducing the lifetime and/or the mobility of the charge carriers, an emitter efficiency is reduced. Thus, it is possible to compensate for even a comparatively high doping level, i.e., a comparatively high second concentration of first charge carriers in the contact region 121 with respect to its a priori negative influence on the switching behavior of the semiconductor device 1 or, respectively, of the semiconductor component 4. Thus, a semiconductor structure is presented that allows for establishing a low ohmic contact between the semiconductor and the diffusion barrier by means of said highly doped contact region 121 without deteriorating switching behavior.

In the above, embodiments pertaining to semiconductor devices, semiconductor component to metal contact transitions, and methods of manufacturing a semiconductor device were explained. For example, the embodiments pertaining to semiconductor devices and semiconductor components are based on silicon (Si). Accordingly, a monocrystalline semiconductor region or layer, e.g., the first and second semiconductor regions 12 and 13 of exemplary embodiments, is typically a monocrystalline Si-region or Si-layer. In other embodiments, polycrystalline or amorphous silicon may be employed.

It should, however, be understood that the semiconductor regions 12 and 13 can be made of any semiconductor material suitable for manufacturing a semiconductor device/component. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device comprising a first semiconductor region having first charge carriers of a first conductivity type and a second semiconductor region having second charge carriers, wherein the first semiconductor region comprises:
    a transition region in contact with the second semiconductor region, the transition region having a first concentration of the first charge carriers;
    a contact region having a second concentration of the first charge carriers, wherein the second concentration is higher than the first concentration; and
    a damage region between the contact region and the transition region, the damage region being configured to reduce lifetime and/or mobility of the first charge carriers of the damage region as compared to the lifetime and/or the mobility of the first charge carriers of the contact region and the transition region.

2. The semiconductor device of claim 1, wherein the contact region is doped with a contact region doping material, the contact region doping material comprising at least one of boron and phosphorus, and wherein the contact region doping material establishes a presence of the first charge carriers in the contact region.

3. The semiconductor device of claim 1, wherein the damage region is doped with a damage region doping material, the damage region doping material comprising at least one of germanium, silicon, carbon, helium, neon, argon, xenon, and krypton.

4. The semiconductor device of claim 3, wherein the damage region doping material is not activated.

5. The semiconductor device of claim 1, wherein the transition region and the contact region are doped with a same contact region doping material, and wherein the contact region doping material included in the transition region establishes a presence of the first charge carriers in the transition region.

6. The semiconductor device of claim 1, wherein the second semiconductor region is doped with a second semiconductor region doping material, the second semiconductor region doping material establishing a presence of the second charge carriers.

7. The semiconductor device of claim 6, wherein the second semiconductor region doping material comprises at least one of phosphorus, arsenic and antimony.

8. The semiconductor device of claim 1, wherein the damage region has, in a direction of a flow of a load current conducted by the semiconductor device, a thickness in a range of 50 nm to 1000 nm.

9. The semiconductor device of claim 1, wherein the contact region has, in a direction of a flow of a load current conducted by the semiconductor device, a thickness in the range of 50 nm to 1000 nm.

10. The semiconductor device of claim 1, wherein the transition region has, in a direction of a flow of a load current conducted by the semiconductor device, a thickness in the range of 200 nm to 10000 nm.

11. The semiconductor device of claim 1, wherein the second concentration of the first charge carriers in the contact region is at least 50 times as high as the first concentration of the first charge carriers in the transition region.

12. The semiconductor device of claim 1, wherein the damage region extends, in a direction of a flow of a load current conducted by the semiconductor device, deeper into the first semiconductor region than the contact region, and wherein the transition region extends deeper into the first semiconductor region than the damage region.

13. A semiconductor component to metal contact transition, the metal contact comprising:
    a metallization layer configured for being contacted by an external contactor and for receiving a load current via the external contactor,
    wherein the semiconductor component comprises:
        a first semiconductor region having first charge carriers of a first conductivity type; and
        a second semiconductor region having second charge carriers;
    wherein the first semiconductor region comprises:
        a transition region in contact with the second semiconductor region, the transition region having a first concentration of the first charge carriers;
        a contact region having a second concentration of the first charge carriers, the second concentration being higher than the first concentration;
        a damage region between the contact region and the transition region, the damage region being configured for reducing lifetime and/or mobility of the first charge carriers of the damage region as compared to the lifetime and/or the mobility of the first charge carriers of the contact region and the transition region.

14. A method of manufacturing a semiconductor device, the method comprising:

providing a first semiconductor region having first charge carriers of a first conductivity type and a second semiconductor region having second charge carriers, wherein the first semiconductor region comprises a transition region in contact with the second semiconductor region, the transition region having a first concentration of the first charge carriers; and forming, in the first semiconductor region, a contact region having a second concentration of the first charge carriers that is higher than the first concentration;

forming, in the first semiconductor region, a damage region configured for reducing lifetime and/or mobility of the first charge carriers of the damage region as compared to the lifetime and/or the mobility of the first charge carriers of the contact region and the transition region.

15. The method of claim 14, wherein creating the damage region comprises applying a damage implantation of a damage region doping material between the contact region and the transition region.

16. The method of claim 15, wherein the damage doping material is not activated during manufacturing of the semiconductor device.

17. The method of claim 15, wherein the damage region doping material comprises at least one of germanium, silicon, carbon, helium, neon, argon, xenon, and krypton, and wherein an implantation dose of the damage implantation is in the range of $10^{11}$ cm$^{-2}$ to $10^{15}$ cm$^{-2}$.

* * * * *